(12) United States Patent
Dring et al.

(10) Patent No.: US 6,396,306 B2
(45) Date of Patent: May 28, 2002

(54) REGENERATIVE TIE-HIGH TIE-LOW CELL

(75) Inventors: Graham Dring, Bedford; Tammy Timms, Bromhan, both of (GB)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/876,539

(22) Filed: Jun. 7, 2001

(51) Int. Cl.[7] .............................. H03K 19/094
(52) U.S. Cl. .................... 326/104; 326/113; 326/119; 326/121; 326/106; 326/108
(58) Field of Search ................. 326/104, 106, 326/108, 112, 114, 119, 121

(56) References Cited

U.S. PATENT DOCUMENTS 6,043,684 A * 3/2000 Landry .................. 326/98
6,252,426 B1 * 6/2001 Fulkerson ............... 326/113

* cited by examiner

*Primary Examiner*—Michael Tokar
*Assistant Examiner*—Vibol Tan
(74) *Attorney, Agent, or Firm*—J. Dennis Moore; W. James Brady, III; Frederick J. Telecky, Jr.

(57) ABSTRACT

A regenerative tie-high, tie-low cell (circuit) that provides unconditionally stable logic (1 and 0) output states used to tie off logic inputs. The circuit of this invention eliminates any current flow through p-channel/n-channel transistor pairs found in many conventional circuits and adds a regenerative transistor 42 to assure rapid response in achieving the proper logic output states. In one preferred embodiment, the circuit consists of only three CMOS transistors 40–42 that reduce the silicon area required, lowers the cost, and improves the overall reliability.

10 Claims, 2 Drawing Sheets

REGENERATIVE TIE-HIGH TIE-LOW CELL

This application claims priority under 35 USC §(e)(1) of Singapore Application Number 200003286-2 filed Jun. 13, 2000.

BACKGROUND OF THE INVENTION

1. Field of the Invention

This invention relates to integrated circuits and particularly to the family of logic circuits.

2. Description of the Related Art

Tying off unused logic inputs to the supply rails ($V_{cc}$ and GND) can be risky due to the damaging consequences of electrostatic discharge (ESD), particularly where the inputs are tied to transistor gates. FIGS. 1a and 1b show the schematic and block diagram, respectively, for a conventional tie-off circuit. This type circuit has been used to provide logic high (HI) and logic low LO) voltages that reduce the ESD risk when tying off unused inputs. As shown in the block diagram 7 of FIG. 1b, the circuit consists logically of a two-input NAND gate 9 and an inverter 8 with the NAND gate's 9 output tied to one of it's inputs (I1) and to the inverter's 8 input. The output of the inverter 8 is tied to the second input (I2) of the NAND gate 9. The HI tie-off voltage is taken from the output of the NAND gate 9 and the LO tie-off voltage is taken from the output of the inverter 8. Since the inverter 8 assures that one of the NAND gate's inputs is complementary to it's other input, under normal conditions one input to the NAND gate 9 will always be a logic LO level, forcing the NAND gate's output to a logic HI level and as a result the output of the inverter will always be at a logic LO level.

In the schematic for the conventional tie-off circuit of FIG. 1a, the inverter 8 consists of a p-channel transistor 5 and an n-channnnel transistor 6 pair. The gates of these two transistors 5,6 are tied together to form the inverter's input and the drains of the transistors 5,6 are also tied together to form the inverter's output at node 2 (N2). To complete the inverter circuit, the source of the p-channel transistor 5 is tied to $V_{cc}$ and the source of the n-channel transistor 6 is tied to GND. The NAND gate 9 consists of two p-channel input transistors 1,2 and two n-channel transistors 3,4. The gates of one of the p-channel transistors 1 and one of the n-channel transistors 3 are tied together to form input I2 of the NAND gate 9, which is connected to the output of the inverter 8 at node 2 and to the LO output terminal of the circuit. The drains of these two transistors 1,3 are tied together to form the HI output terminal at node 1 (N1) and also connects to the I1 input of the NAND gate 9 and to the input of the inverter 8. The sources of the two p-channel transistors 1,2 are tied to $V_{cc}$. In the NAND gate circuit, the two n-channel transistors 3,4 are connected in series with the source of one of these transistors 3 connected to the drain of the other transistor 4. Finally, the source of transistor 4 is connected to GND. In this circuit configuration, one of the two n-channel transistors 3,4 is always OFF so that no current flows through this portion of the circuit.

The above degenerative (negative feedback) circuit consists of n-channel, p-channel transistor pairs that can under certain conditions, converge with HI and/or LO outputs in an alternative state where the HI and LO output levels are at voltages intermediate between $V_{DD}$ and GND. In other words, the HI and LO levels are not uniquely defined and for certain conditions a metastable state can exist with poorly defined HI and/or LO levels. Such things as process spread, supply resistance, and GND resistance can cause these uncertain conditions. FIG. 2 illustrates the possible metastable states that can exist where the HI output is less than the logic 1 level and/or the LO output is greater than the logic 0 level; e.g., given as:

HI=$\alpha$ $V_{cc}$, where 0<$\alpha$<1, and

LO=$\beta$ $V_{cc}$, where 0<$\beta$<1.

The metastable level characteristics for the NAND gate and inverter, respectively, are as follows:

$\alpha = f(\alpha, \beta)$ and $\beta = f(\alpha)$.

As a result, it is possible that $\alpha$ can be significantly low and/or that $\beta$ can be significantly high so that incorrectly defined logical levels result. This means that it is possible to have tie-off levels where the HI and LO levels are significantly below the $V_{cc}$ and/or above the GND level to the extent that it effects the logical output of the overall circuit function.

There is a recognized need for a tie-off circuit which provides for ESD protection and at the same time has uniquely defined HI and LO output levels that correspond to the $V_{cc}$ and GND levels, respectively. The invention described herein addressed this need.

SUMMARY OF THE INVENTION

A regenerative tie-high, tie-low cell (circuit) for tying off logic inputs that provides unconditionally stable logic 1 and 0 output states, is disclosed. The circuit provides uniquely defined HI and LO states to overcome the poorly defined metastable states that can exist in conventional circuits of this type, where the circuit can converge with HI and/or LO outputs in an alternative state with intermediate HI and LO output voltage levels between $V_{DD}$ and GND. The circuit eliminates p-channel/n-channel transistor pair current paths and adds a regenerative transistor to force the circuit to its desired operating state.

Finally, in a first preferred embodiment, the circuit consists of only three CMOS transistors, reducing the required silicon area and in turn improving the reliability and lowering the cost of fabricated ICs.

DETAILED DESCRIPTION

Figure 1A:
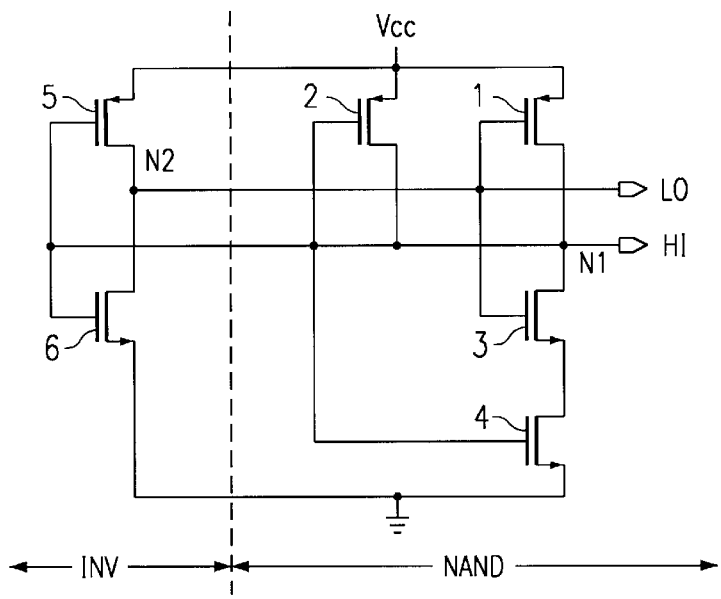
FIG. 1a is a schematic for a conventional tie-off circuit requiring six CMOS transistors. (prior art)
Figure 1B:
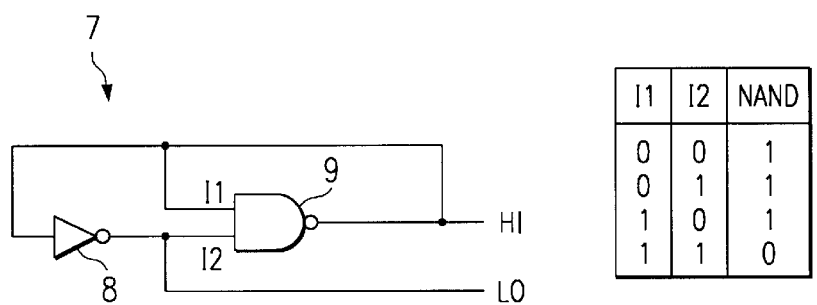
FIG. 1b is a logic block diagram for the conventional tie-off circuit of FIG. 1. (prior art)
Figure 2:
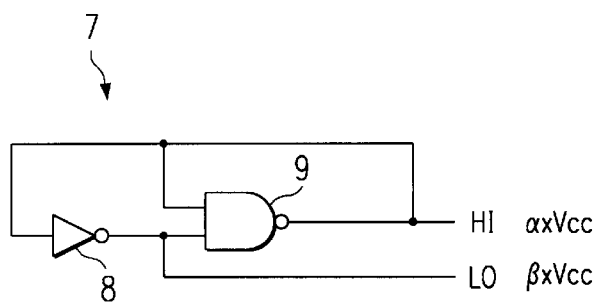
FIG. 2 is a diagram illustrating the metastable levels that can exist in the conventional logic tie-off circuit of FIG. 1. (prior art)
Figure 3:
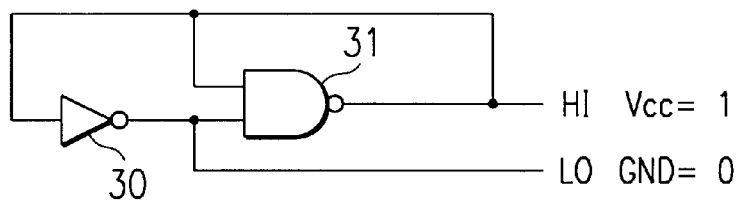
FIG. 3 is a diagram illustrating the desired logic levels for a logic tie-off circuit.

The desired characteristics of a logic tie-off cell (circuit) is one that is stable with the HI (1) level always at the $V_{cc}$ voltage and the LO (0) level always at GND, as illustrated in the logic block diagram of FIG. 3. This invention accomplishes the desired goal.

Figure 4:
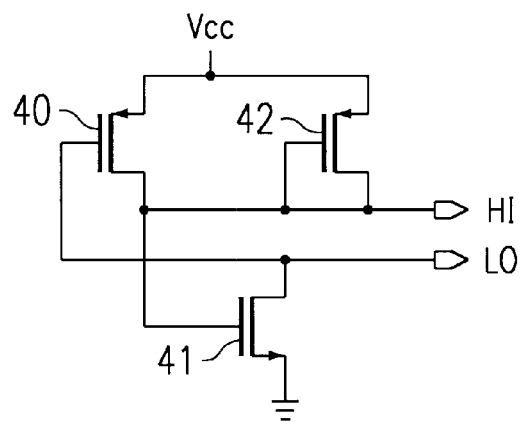
FIG. 4 is a schematic for one embodiment of the tie-off circuit of this invention.

The schematic for a first embodiment of the tie-off cell (circuit) of this invention is shown in FIG. 4. The regenerative nature of this circuit overcomes the possibility of a metastable state that can exist in conventional circuits, as discussed in the prior art, and assures that the circuit quickly achieves the desired output (1 and 0) logic state. This circuit has no p-channel/n-channel transistor pair current paths and as a result, eliminates all non-$V_{cc}$ and/or non-GND nodes that can cause the poorly define metastable states. The circuit consists of three CMOS transistors: two p-channel transistors 40 and 42, and an n-channel transistor 41. The circuit is wired such that the drain of one of the channel transistors 40 is tied to the gate of the n-channel transistor 41 and in a reciprocal fashion, the drain of the n-channel transistor 41 is tied to the gate of this p-channel transistor 40. The HI output signal is taken off the drain of the p-channel transistor 40 while the LO output signal is taken off the drain of the n-channel transistor 41. The second p-channel transistor 42 is added to provide a startup state and assures that the gate of the n-channel transistor 41 is never LO or floating. Transistors 40 and 41 provide regeneration (positive feedback) to maintain the correct HI and LO states. Both the gate and drain of this second p-channel transistor 42 are tied to the drain of the other p-channel transistor 40 (HI output) and to the gate of the n-channel transistor 41. The sources of both p-channel transistors 40 and 42 are tied to the $V_{cc}$ supply and the source of the n-channel transistor 41 is tied to GND.

In operation, the p-channel transistor's 40 drain performs a pull-up on the n-channel transistor's 41 gate, turning the transistor 41 ON and forcing its output LO. Likewise, the n-channel transistor's 41 drain performs a pull-down on the p-channel transistor's 40 gate, turning the transistor 40 ON and forcing its output HI. As long as either of these conditions is performed the desired HI/LO output logic levels will be achieved since both the p-channel transistor 40 and the n-channel transistor 41 are ON. Under normal operating conditions, the P-channel transistor 42 is OFF. However, if for any reason the gate of the n-channel transistor 41 (also the gate of p-channel transistor 42) is ever momentarily LO or floating, this will turn ON the p-channel transistor 42, which in turn will pull the gate of the n-channel transistor 41 high, turning transistor 41 ON, and this in turn will pull down the gate of the p-channel transistor 40, turning transistor 40 ON, to achieve the desired HI/LO output states.

Figure 5:
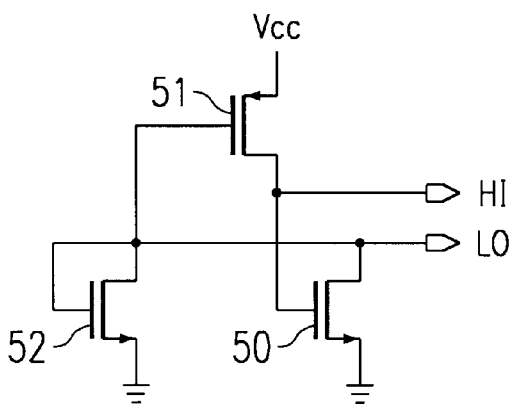
FIG. 5 is a schematic for a second embodiment of the tie-off circuit of this invention.

A second complementary embodiment of the tie-off cell (circuit) of this invention is shown in the schematic of FIG. 5. Like the circuit of FIG. 4, this circuit has no p-channel/n-channel transistor pairs and as a result, eliminates all non-$V_{cc}$ and/or non-GND nodes that can cause the poorly define metastable states. This circuit also consists of three CMOS transistors: two n-channel transistor 50 and 52, and a p-channel transistor 51. The circuit is wired such that the drain of one of the n-channel transistors 50 is tied to the gate of the p-channel transistor 51 and in a reciprocal fashion, the drain of the p-channel transistor 51 is tied to the gate of this n-channel transistor 50. The HI output signal is taken off the drain of the p-channel transistor 51 while the LO output signal is taken off the drain of the n-channel transistor 50. The second n-channel transistor 52 is added to provide a startup state and assures that the gate of the p-channel transistor 51 is never HI or floating. Transistors 50 and 51 provide regeneration (positive feedback) to maintain the correct HI and LO states. Both the gate and drain of the n-channel transistor 52 are tied to the drain of the other n-channel transistor 50 (LO output) and the gate of the p-channel transistor 51. The sources of both p-channel transistors 50 and 52 are tied to GND and the source of the p-channel transistor 51 is tied to the $V_{cc}$ supply. In operation, the n-channel transistor's 50 drain performs a pull-down on the p-channel transistor's 51 gate, turning the transistor 51 ON and forcing its output HI. Likewise, the p-channel transistor's 51 drain performs a pull-up on the n-channel transistor's 50 gate, turning the transistor 50 ON and Forcing its output LO. As long as either of these conditions is performed the desired HI/LO output levels will be achieved since both the n-channel transistor 50 and the p-channel transistor 51 are ON. Under normal operating conditions, the n-channel transistor 52 is OFF. However, if for any reason the gate of the p-channel transistor 51 (also the gate of n-channel transistor 52) is ever momentarily HI or floating, this will turn ON the p-channel transistor 52 which in turn will pull the gate of the p-channel transistor 51 low, turning transistor 51 ON, and in turn will pull up the gate of the n-channel transistor 50, turning transistor 50 ON, to achieve the desired HI/LO output states.

The primary advantages of the cell(s) of this invention are (1) the unconditional stable output logic states, (2) the elimination of any transistor pair current paths which prevents the possibility of metastable states, (3) the minimal transistor count which results in a reduction of required silicon area, and (4) the regenerative functionality of the circuit.

While this invention has been described in the context of two preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

I claim:

1. A tie-off circuit, which exhibits stable tie-high, tie-low logic outputs, comprising:

a first transistor;

a second transistor; and a third transistor that provides positive feedback to assure that said second and third transistors are at desired states.

2. The tie-off circuit of claim 1, wherein said first, second, and third transistors each have a first electrode, a second electrode, and a third electrode.

3. The tie-off circuit of claim 2, wherein said first electrodes of said first, second, and third transistors are the drain leads of said transistors;

said second electrodes of said first, second, and third transistors are the gate leads of said transistors; and said third electrodes of said first, second, and third transistors are the source leads of said transistors.

4. The tie-off circuit of claim 3, wherein non-$V_{cc}$ or GND voltage nodes are eliminated.

5. The tie-off circuit of claim 4, wherein the flow of current through p-channel/n-channel transistor pairs is eliminated.

6. The tie-off circuit of claim 5 that is functionally regenerative.

7. The tie-off circuit of claim 6, wherein said first and third transistors are p-channel CMOS transistors; and said second transistor is an n-channel CMOS transistor.

8. The tie-off circuit of claim 7, wherein said first electrode of said first transistor is tied to said second electrode of said second transistor, to said first and second electrodes of said third transistor, and to the HI output terminal;

said first electrode of said second transistor is tied to said second electrode of said first transistor and to the LO output terminal;

said third electrodes of said first and third transistors are tied to $V_{cc}$ supply voltage; and said third electrode of said second transistor is tied to GND.

9. The tie-off circuit of claim 6, wherein said first and third transistors are n-channel transistors; and said second transistor is a p-channel transistor.

10. The tie-off circuit of claim 9, wherein said first electrode of said first transistor is tied to said second electrode of said second transistor, to said first and second electrodes of said third transistor, and to the LO output terminal;

said first electrode of said second transistor is tied to said second electrode of said first transistor and to the HI output terminal;

said third output terminals of said first and third transistors are tied to GND; and said third electrode of said second transistor is tied to $V_{cc}$ supply voltage.

* * * * *